United States Patent [19]

Orbach et al.

[11] Patent Number: 5,260,597
[45] Date of Patent: Nov. 9, 1993

[54] ROUTING STRUCTURE FOR A CUSTOMIZABLE INTEGRATED CIRCUIT

[75] Inventors: Zvi Orbach; Uzi Yoeli, both of Haifa, Israel

[73] Assignee: Quick Technologies Ltd., Haifa, Israel

[21] Appl. No.: 622,833

[22] Filed: Jan. 7, 1991

Related U.S. Application Data

[63] Continuation-in-part of Ser. No. 344,582, Apr. 28, 1989, Pat. No. 5,049,969, which is a continuation-in-part of Ser. No. 222,514, Jul. 21, 1988, Pat. No. 4,933,738.

[51] Int. Cl.⁵ .................. H01L 27/02; H01L 23/48; H01L 29/46; H01L 29/54
[52] U.S. Cl. .................................. 257/529; 257/665; 257/775
[58] Field of Search ................. 357/51; 257/529, 665, 257/775

[56] References Cited

U.S. PATENT DOCUMENTS 4,240,094 12/1980 Mader .

FOREIGN PATENT DOCUMENTS 1135992 12/1968 United Kingdom .

Primary Examiner—J. Carroll
Attorney, Agent, or Firm—Ladas & Parry

[57] ABSTRACT

A selectably customizable semiconductor device including a first metal layer disposed in a first plane and including first elongate strips extending parallel to a first axis, a second metal layer disposed in a second plane generally parallel to and electrically insulated from said first plane and including second elongate strips extending parallel to a second axis, the second axis being generally perpendicular to the first axis, whereby a multiplicity of elongate strip overlap locations are defined at which the elongate strips of the first and second metal layers overlap in electrical insulating relationship;

the second metal layer comprising a plurality of fusible conductive bridges joining adjacent pairs of the second elongate strips, each of the fusible conductive bridges including first and second fusible links;

a via being defined between the first and second metal layers at a location along each of the fusible conductive strips intermediate the first and second fusible links;

the fusible conductive bridges joining the adjacent pairs of the second elongate strips overlying alternating first elongate strips and being arranged in a staggered arrangement.

12 Claims, 11 Drawing Sheets

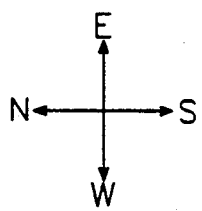
FIG. 1B
PRIOR ART
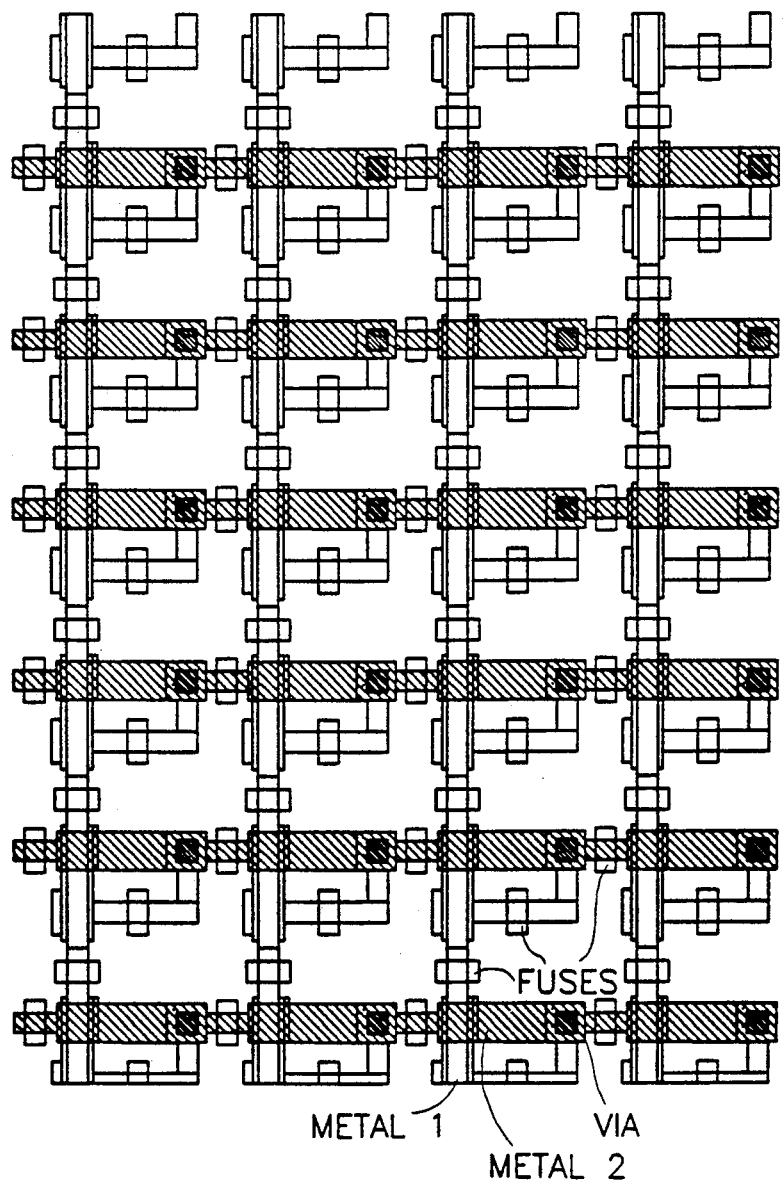

ROUTING STRUCTURE FOR A CUSTOMIZABLE INTEGRATED CIRCUIT

REFERENCE TO COPENDING APPLICATIONS

This is continuation-in-part of U.S. patent application No. 344,582, entitled CUSTOMIZABLE DEVICES, filed, Apr. 28, 1989, now U.S. Pat. No. 5,049,969 which is a continuation-in-part of U.S. patent application No. 222,514, filed Jul. 21, 1988, now U.S. Pat. No. 4,933,738.

FIELD OF THE INVENTION

The present invention relates to semiconductor devices generally and more particularly to customizable semiconductor devices.

BACKGROUND OF THE INVENTION

Integrated circuits are electronic circuits which normally include a very large number of semiconductor elements, such as transistors and diodes, as well as other electronic components, in highly compact form on a silicon wafer. The basic principle underlying integrated circuits is that instead of building an electronic circuit out of discrete components such as transistors, diodes, resistors and capacitors, the entire circuit is fabricated on the same piece of silicon in the form of a number of superimposed layers of conducting, insulating and transistor forming materials. By arranging predetermined geometric shapes in each of these layers, a circuit having a required function is realized.

The process by which an integrated circuit is fabricated is long and complex and basically includes the following steps:

1. A polished silicon wafer is exposed to an appropriate material in a high temperature furnace in order to "grow" a uniform layer of the material on its surface.
2. After the wafer is cooled, it is coated with a thin film of resist material, which is dried and baked.
3. At the same time, a mask for the appropriate layer is created, which defines the precise pattern required on the silicon surface.
4. This mask is brought firmly into proximity with the coated wafer and exposed to intense ionizing radiation such as ultraviolet light or low-energy x-rays. In areas wherein the mask is transparent to such radiation, the ionizing radiation passes into the resist and breaks down its molecular structure. The portions of the resist that are covered by opaque portions of the mask are not affected.
5. The resist is then developed by immersing the silicon wafer in a solvent which dissolves the resist only at the locations which were exposed to the ionizing radiation.
6. The wafer is then exposed to an appropriate etching material which is effective to remove the material grown previously thereon (Step 1), except where the material is covered by resist, thus defining a desired pattern of the grown material.
7. The remaining resist material is then removed.

The above process is repeated for each of the layers of material forming the integrated circuit. In most integrated circuit technology one or more layers of metal are employed for internal connections on the integrated circuit. These metal layers are usually formed last.

As can be readily appreciated, the above process requires sophisticated machinery and custom masks which must be specially set up for each specific type of custom integrated circuit to be fabricated. For the process to be at all economical, extremely large quantities of integrated circuits must be produced for a given set up. Since there exist applications wherein the quantities desired of a specific circuit are not extremely large, techniques have been developed for producing integrated circuits known as gate arrays. In these gate arrays, a large amount of transistors and other components are produced by the above-described mass production techniques. Specific interconnections therebetween suitable for a specific circuit are then formed on the chip by etching a suitable metal layer thereon. There exist advanced gate-arrays wherein two or more layers of custom metal interconnections may be custom etched.

Despite the use of sophisticated computer aided design and semi-custom devices, the widespread use of dedicated non-standard integrated circuits is still limited because of the high costs and long lead time involved in their fabrication. Many users of integrated circuits still make extensive use of standard, "off the shelf" available small scale and medium scale integrated circuits.

Electronic circuits manufactured by combining a large number of such standard integrated circuits have a number of disadvantages:

a. A large number of printed circuit boards are required, resulting in an expensive product, relatively long assembly time, relative difficulty in maintenance and troubleshooting and large size.
b. Lower electrical power efficiency is realized. As a result, relatively larger power sources are required and heavier and larger products result.

There are known integrated circuits such as EPROMS and PALS (programmable array logic) which are programmed by fusing which is accomplished electrically via the integrated circuit's input/output pins, requiring elaborate extra fusing circuitry for this purpose.

There are also known techniques for increasing yield of integrated circuits by excising inoperative portions thereof by fusing. This is normally done on wafers including a multiplicity of integrated circuits.

It is also known to produce gate arrays which are laser programmable. Such devices are described in a publication of Laserpath, Inc. of Sunnyvale, Calif. 94086 USA entitled "One Day Prototype Laser Programmed Arrays" dated Feb. 26, 1986.

Dual metal layer integrated circuit technology has been developed in recent years to enable automatic computer software controlled generation of integrated circuit layouts, commonly known as routing. In the early years of integrated circuit development, routing was done by hand. Due to the increased complexity and density of contemporary integrated circuits, manual routing is no longer possible.

Dual metal layer technology provides two independent routing layers extending in respective perpendicular directions, commonly termed North-South and East-West. Changes in direction are provided by vias which interconnect the two layers, the vias typically being defined by an opening in the insulating layer between the two metal layers, being filled by metal from one of the two layers. A simple dual metal layout wherein vias are positioned at the locations of the desired direction changes is shown in FIG. 1A, wherein the horizontal strips are typically a metal I layer, indicated as M1, the vertical strips are typically a metal II layer, indicated as M2, and the vias interconnecting the two layers are labeled. The metal II layer overlies the metal I layer.

In order to permit rapid customization of dual metal type integrated circuits, it is desired that such customization be solely produced by fuse disconnection rather than by applying metal across a gap. Accordingly, configurations such as that shown in FIG. 1B were developed to combine the advantages of automatic routing with those of rapid customization, such that customization can be carried out by an automatic routing technique. In the configuration of FIG. 1B the East-West strips are indicated to be metal I while the North-South strips are indicated to be metal II and a via connecting the metal I and metal II layers is disposed adjacent each crossing of the respective metal I and metal II strips. The via underlies the metal II strip and is joined to the metal I strip by means of a branch having a fuse formed thereon. Fuses are also provided along the metal II strips between adjacent vias and along the metal 1 strips between adjacent branches.

Customization of the blank shown in FIG. 1B takes place by traveling along the metal I strips and fusing all fuses on the branches which are not used. If a direction change is desired, a branch is used to establish a connection to the metal II layer. When traveling along the metal II strips, if the desired direction of the strip is, for example, South, the fuses lying to the North are fused or vice versa. FIG. 1C illustrates the equivalent circuit to that shown in FIG. 1A embodied in the structure of FIG. 1B, where /'s over the fuse indicate fused fuses.

U.S. Pat. No. 4,197,555 to Uehara describes a structure in which a relatively long strip of M1 is used. Although this structure is adequate for PAL configuration applications, it is relatively unsuitable for gate array applications, particularly if an automatic place-and-route program is used. Also, the length of the M1 strip acts to increase the line capacitance.

The following patents and copending applications of the Applicant disclose apparatus and techniques, particularly with respect to fusing, which may be useful in putting the present invention into practice: U.S. Pat. No. 4,924,287; U.S. Pat. No. 5,111,273; U.S. Pat. No. 4,875,971, USSN 368,161 filed 16 June, 1989. The disclosures thereof are hereby incorporated by reference.

SUMMARY OF THE INVENTION

The present invention seeks to provide selectably customizable semiconductor devices of the types described above which are compact and thus compatible with high-density architecture, and is useful inter alia in gate array technology and particularly in CMOS gate array technology.

There is thus provided in accordance with a preferred embodiment of the present invention a selectably customizable semiconductor device including a first metal layer disposed in a first plane and including first elongate strips extending parallel to a first axis, a second metal layer disposed in a second plane generally parallel to and electrically insulated from said first plane and including second elongate strips extending parallel to a second axis, the second axis being generally perpendicular to the first axis, whereby a multiplicity of elongate strip overlap locations are defined at which the elongate strips of the first and second metal layers overlap in electrical insulating relationship;

the second metal layer comprising a plurality of columns of fusible conductive bridges joining adjacent pairs of the second elongate strips, each of the fusible conductive bridges including first and second fusible links;

a via being defined between the first and second metal layers at a location along each of the fusible conductive bridges intermediate the first and second fusible links;

the fusible conductive bridges in each column joining the adjacent pairs of the second elongate strips overlying alternating first elongate strips and being arranged in a staggered arrangement.

Further in accordance with an embodiment of the invention there may be provided third fusible links disposed along the first elongate strips intermediate the second elongate strips in a staggered orientation.

There may also be provided fourth fusible links disposed along the second elongate strips intermediate the first elongate strips.

In accordance with one embodiment of the invention, the second metal layer also comprises a plurality of third elongate strips, each third elongate strip being disposed parallel to and alongside each second elongate strip and being joined thereto by bridges overlapping every first elongate strip.

In accordance with an embodiment of the invention, the fusible conductive bridges each include a pair of first portions, each of which overlies a different first elongate strip and a second portion interconnecting the pair of first portions and extending generally perpendicularly thereto.

Additionally in accordance with an embodiment of the invention, the second conductive layer also comprises a plurality of pairs of partial branches which extend towards each other from adjacent second elongate strips and a plurality of vias, each associated with one of said partial branches.

There may also be provided fifth fusible links disposed along the partial branches.

Partial branches may be provided at regions overlying first elongate strips where the fusible conductive bridges are not provided.

According to an embodiment of the invention, the second conductive layer includes a plurality of third elongate strips, each third elongate strip being disposed parallel to and alongside each second elongate strip and insulated therefrom.

The first metal layer preferably is a metal I layer and said second metal layer is a metal II layer.

There is also provided in accordance with an embodiment of the invention an at least partially customized semiconductor device as described above and wherein at least some of the fusible links are fused.

There is also provided in accordance with an embodiment of the invention, a method for selectably customizing a customizable semiconductor device comprising the steps of:

providing a selectably customizable semiconductor device as described above; and selectably fusing some of the plurality of fusible links.

The fusing step may include the application of laser radiation to some of the plurality of fusible links. Alternatively chemical etching, ion milling or any other suitable technique may be employed.

BRIEF DESCRIPTION OF THE DRAWINGS

The present invention will be understood and appreciated more fully from the following detailed description, taken in conjunction with the drawings in which:

FIG. 1B illustrates a prior art dual metal layout adapted for automatic routing and rapid customization;

DETAILED DESCRIPTION OF THE INVENTION

For the purpose of ease of understanding the specification which follows, the drawings have been arranged and labeled such that the metal I strips extend East-West and metal II strips extend North-South. The term "first metal layer" normally refers to the metal I layer and the term "second metal layer" normally refers to the metal II layer.

Figure 2:
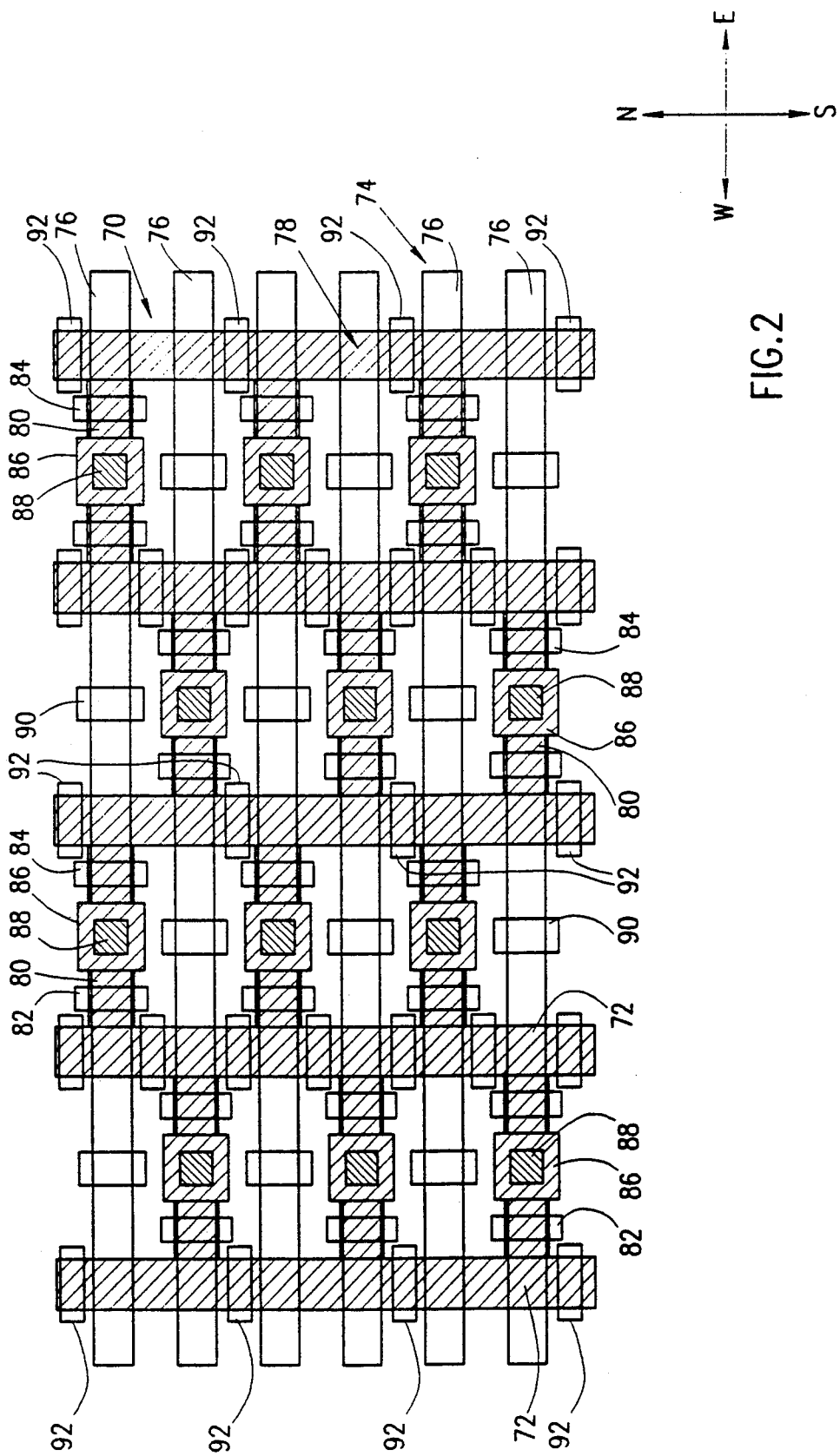
FIG. 2 is an enlarged illustration of a metal on metal structure of a gate array according to a preferred embodiment of the invention.

Reference is now made to FIG. 2, which illustrates a metal on metal structure of a gate array constructed and operative in accordance with a preferred embodiment of the present invention. The structure of FIG. 2 includes a metal layer 70, typically metal II, which is disposed in the plane of the paper and comprises a plurality of parallel elongate strips 72, extending North-South. A metal layer 74, typically metal I, is disposed in a plane generally parallel to and underlying the plane of the metal II layer and is electrically insulated therefrom. The metal I layer comprises a plurality of parallel elongate strips 76, extending East-West.

It is noted that the regions at which the strips 72 and 76 overlie in electrically insulative relationship are here termed elongate strip overlap locations and are indicated by reference numerals 78.

Interconnecting adjacent pairs of elongate strips 72 are a plurality of branch strips 80. The branch strips may constitute the bridges which are mentioned hereinabove in the specification and hereinbelow in the claims. In the embodiment of FIG. 2, the branch strips are straight and extend in overlapping relationship with strips 76. Formed on each of branch strips 80 are a pair of fusible links 82 and 84. Intermediate the fusible links 82 and 84 is a branch overlap location indicated by reference numeral 86. It is noted that branch overlap locations 86 are not found at elongate strip overlap locations 78.

At each branch overlap location 86 there is defined a via 88, providing electrical communication between the branch 80 and the elongate strip 76.

Additionally fusible links 90 are provided along strip 76 between adjacent pairs of strips 72. Fusible links 92 are provided along every second strip 72 between adjacent pairs of strips 76 and along every intervening strip 72 between adjacent strips 76.

It is noted that the structure of FIG. 2 is additionally characterized that branches 80 and vias 88 are provided over every second strip 76 between each pair of strips 72. The branches 80 and vias 88 located between adjacent pairs of strips 72 are "staggered", i.e. are positioned over alternative strips 76 in an out of phase relationship. This arrangement is particularly suitable for configurations having relatively large area vias.

The structure of FIG. 2 is highly compact but requires the ability to fuse a metal II fuse without disturbing an underlying metal I strip.

Figure 3:
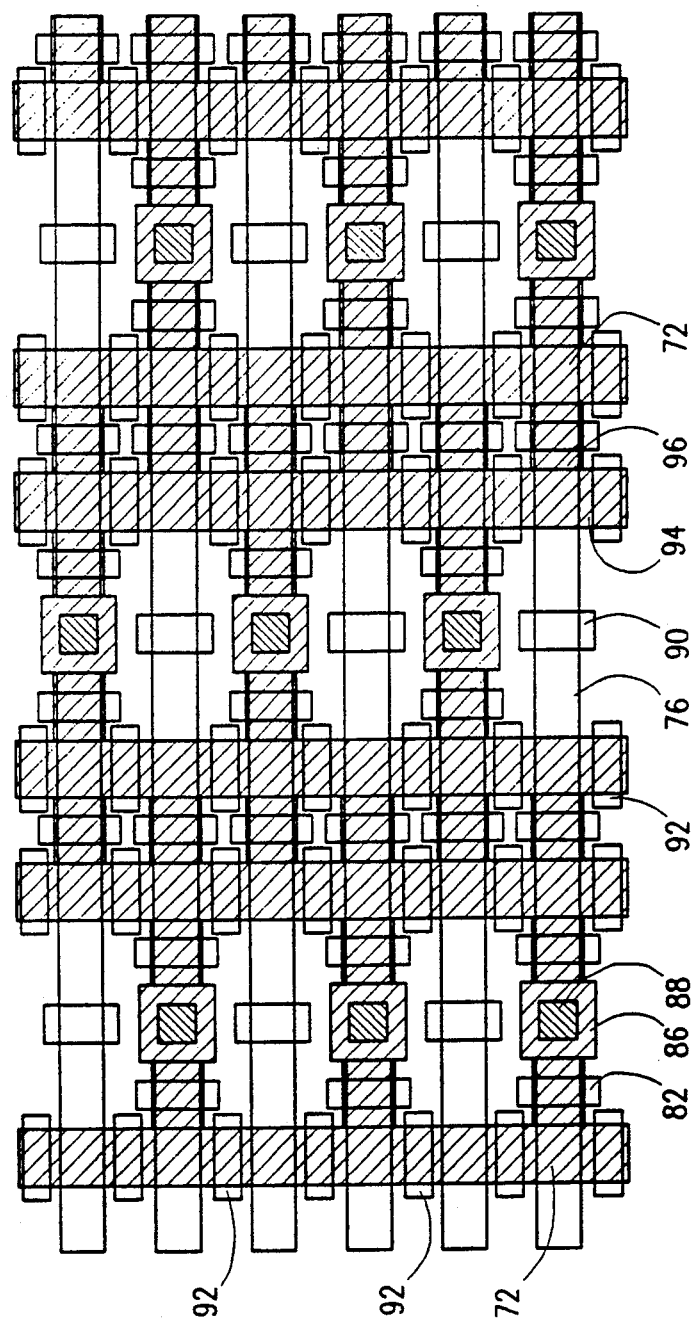
FIG. 3 is an enlarged illustration of a metal on metal structure of a gate array according to another preferred embodiment of the invention.

Reference is now made to FIG. 3 which illustrates, an even more compact grid array than that shown in FIG. 2. The arrangement is identical to that of FIG. 2 with the exception that an extra strip 94 is provided alongside each strip 72. Each adjacent pair of strips 72 and 94 is connected by a branch 96 overlying each strip 76. In this embodiment, fuses 92 are provided along strips 72 and 94 between each strip 76.

It will be noted that to some extent the configuration of FIG. 3 is unusual. In the other structures described herein, for every metal II strip there is a direct connection to every metal I strip, as required for use with conventional Place and Route software for automated personalization. FIG. 3 does not provide this direct connection and therefore requires a modification in the conventional Place and Route software. It is noted however that the configuration of FIG. 3 in fact provides two sets of structures both of which individually provide a direct connection between every metal II strip and every metal I strip. The two sets are interconnected by means of branches 96.

Figure 4:
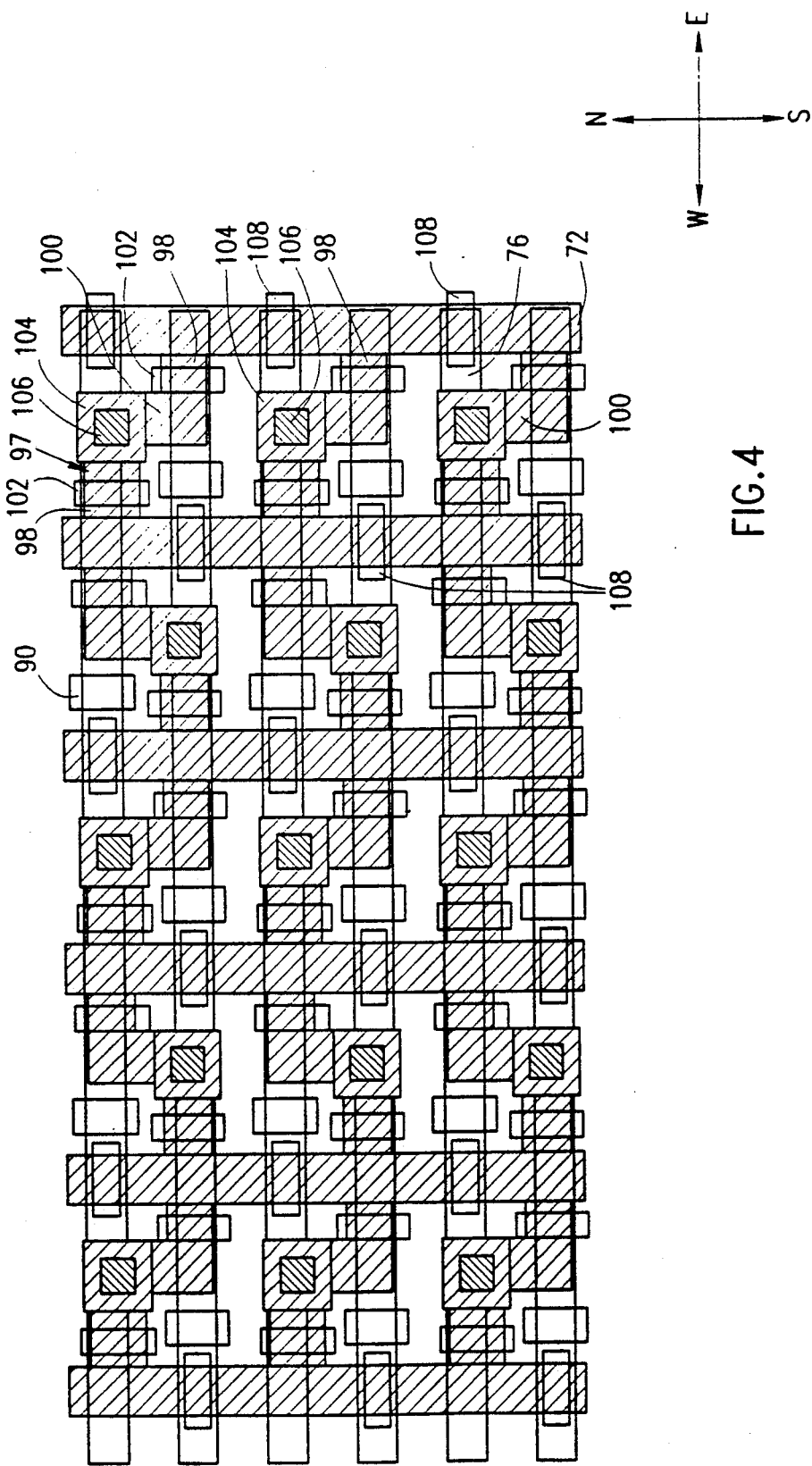
FIG. 4 is an enlarged illustration of a metal on metal structure of a gate array according to still another preferred embodiment of the invention.

Reference is now made to FIG. 4, which illustrates a grid array which is similar to that illustrated in FIG. 2 and which also has similarities to the grid arrays described in copending U.S. patent application No. 344,582, now U.S. Pat. No. 5,049,969 the disclosure of which is hereby incorporated by reference.

A principal, distinction between the embodiment of FIG. 4 and that of FIG. 2, lies in that unlike branch strips 80 of the embodiment of FIG. 2, here the branch strips 97 are not straight but rather bent. Each branch strip 97 defines a pair of East-West portions 98, each of which overlies a different adjacent strip 76, and a North-South portion 100 interconnecting the pair of East-West portions 98.

Formed on each of portions 98 is a fusible link 102. Intermediate the fusible links 102 is a branch overlap location 104. It is noted that branch overlap locations 104 are not found at elongate strip overlap locations. At each branch overlap location 104 there is defined a via 106, providing electrical communication between the branch 96 and the elongate strip 76.

Additionally fuses 108 are provided along strips 72 overlapping every second strip 76 in staggered fashion.

Figure 5:
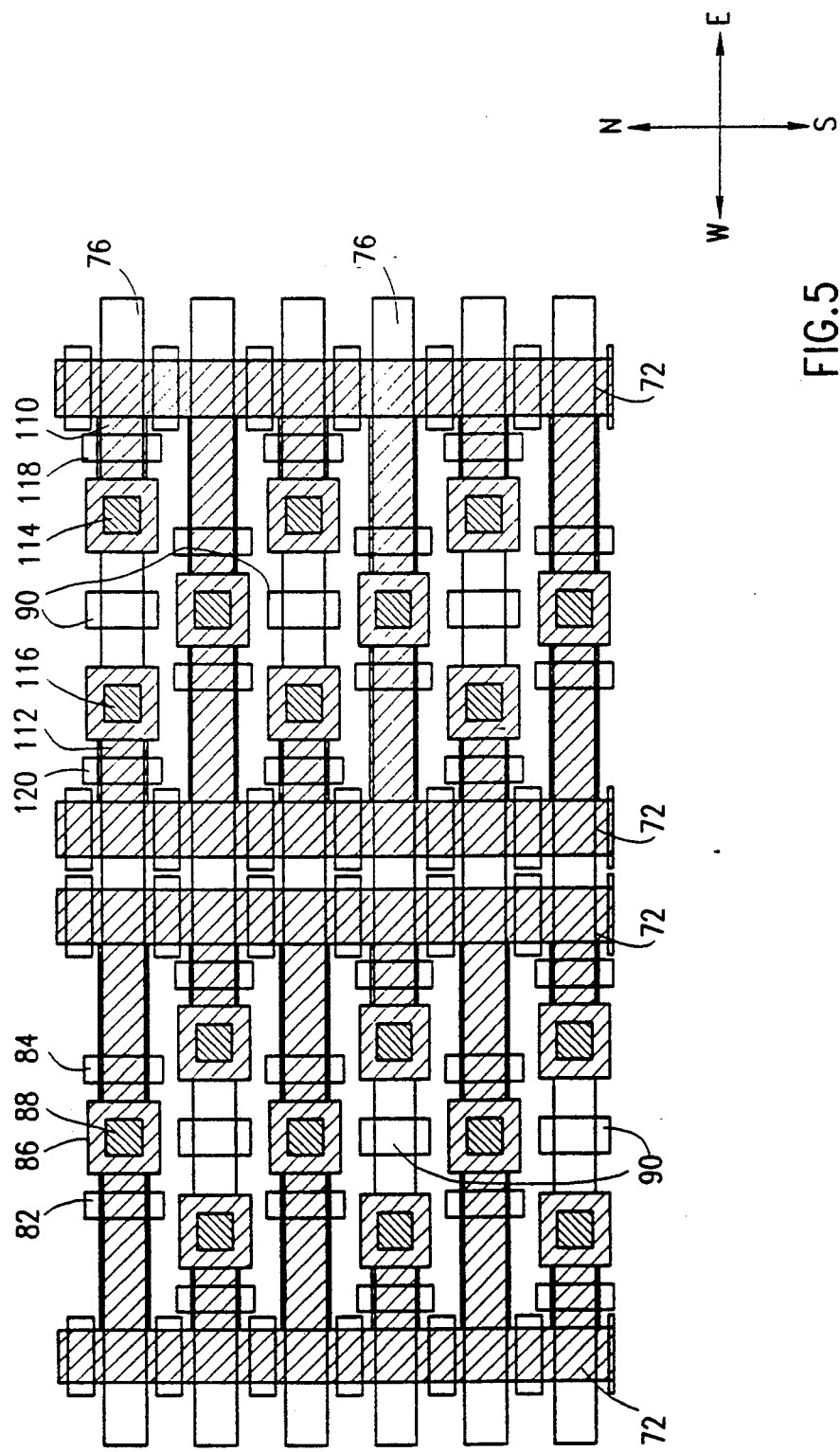
FIG. 5 is an enlarged illustration of a metal on metal structure of a gate array according to yet another preferred embodiment of the invention.
Figure 6:
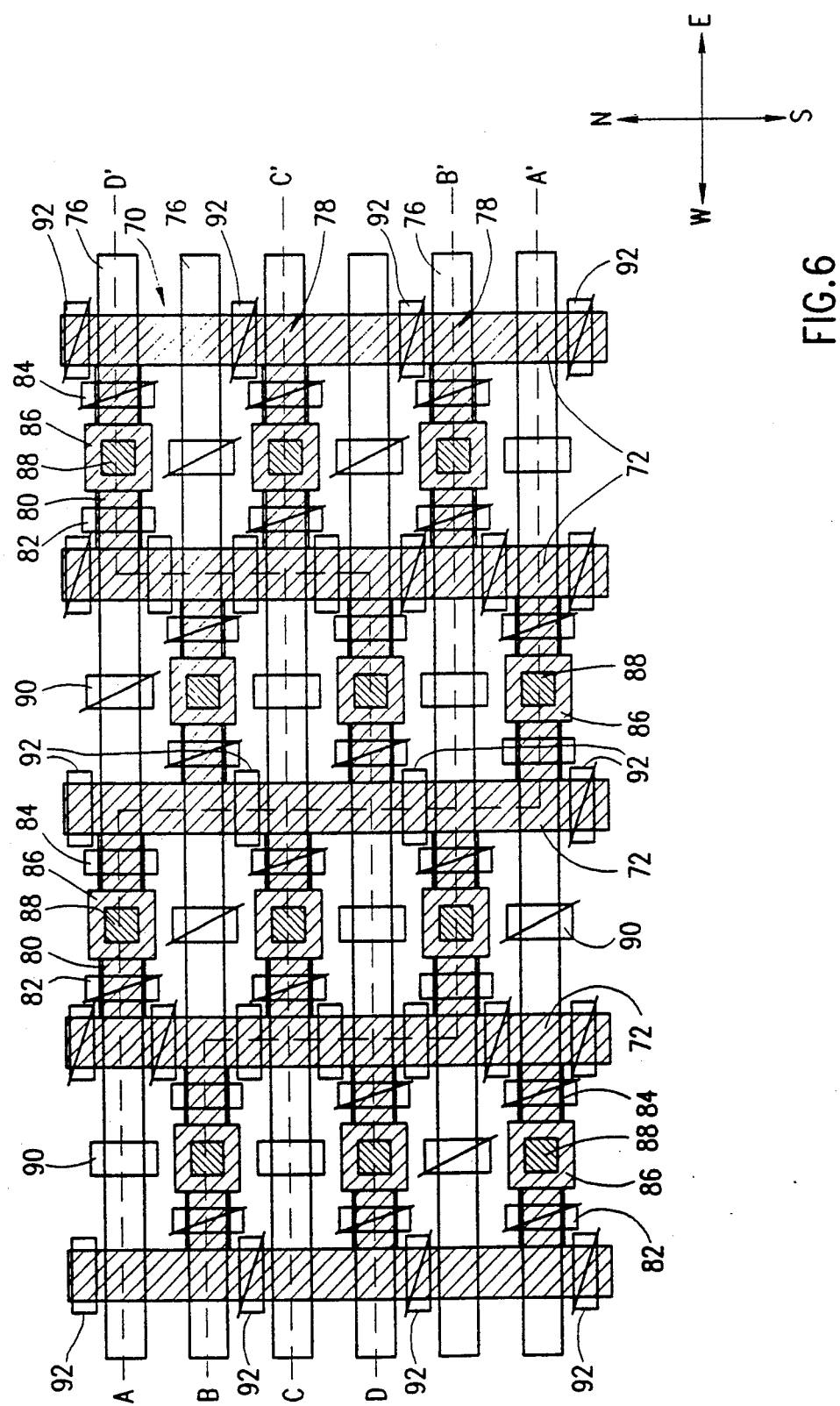
FIG. 6 is an enlarged illustration of the structure of FIG. 2 configured to define the layout of FIG. 1A.
Figure 7:
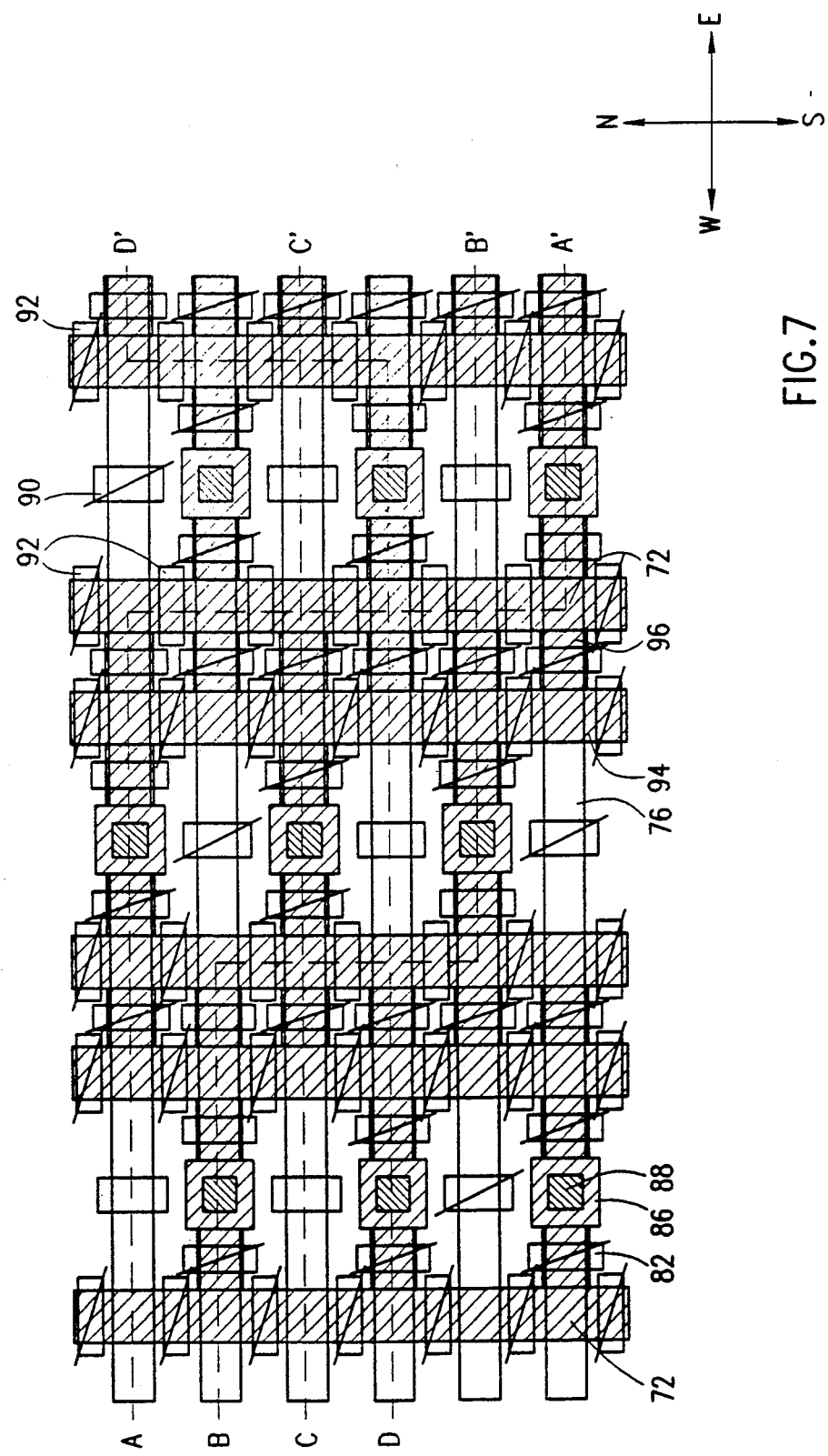
FIG. 7 is an enlarged illustration of the structure of FIG. 3 configured to define the layout of FIG. 1A.
Figure 8:
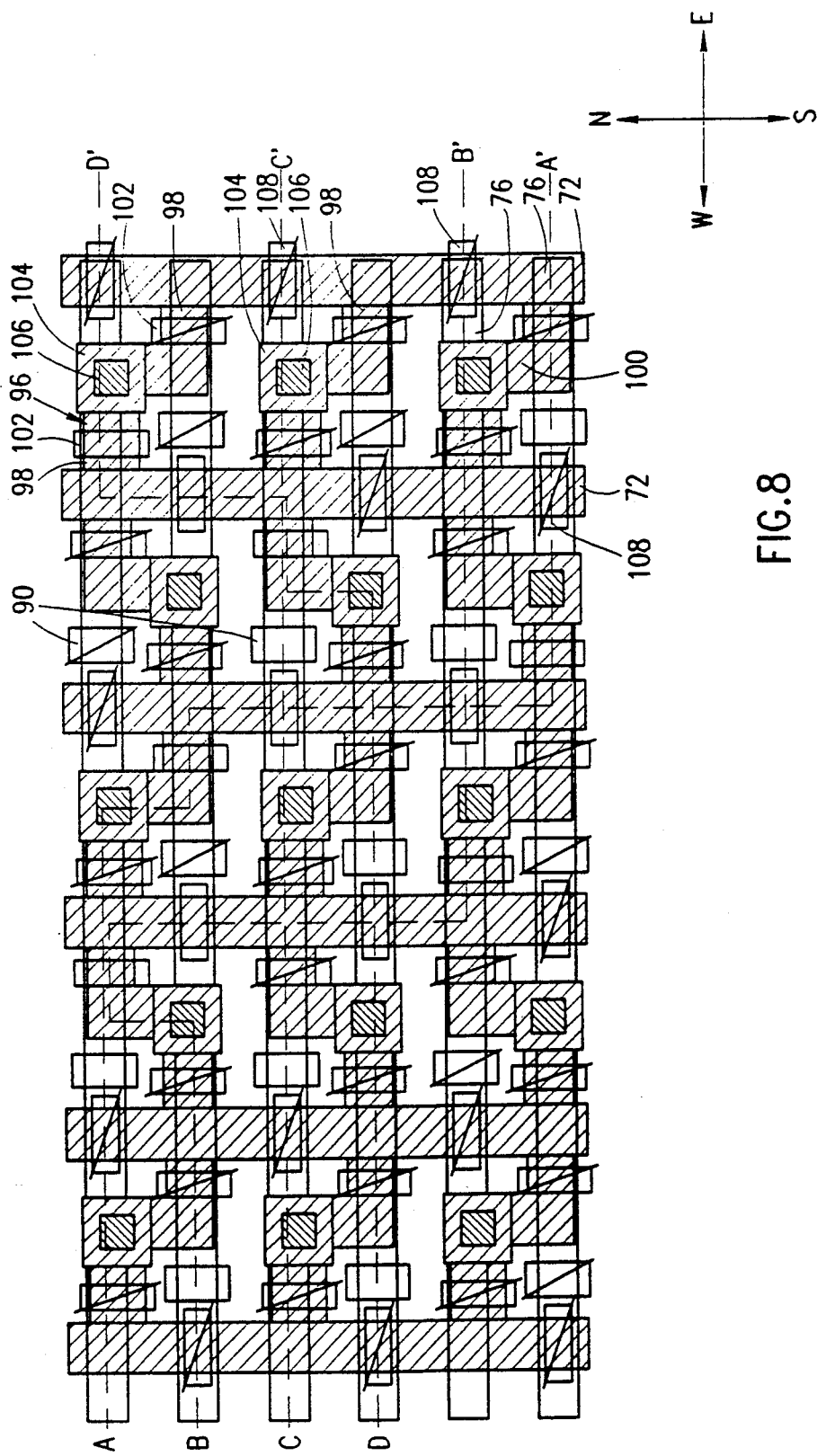
FIG. 8 is an enlarged illustration of the, structure of FIG. 4 configured to define the layout of FIG. 1A.
Figure 9:
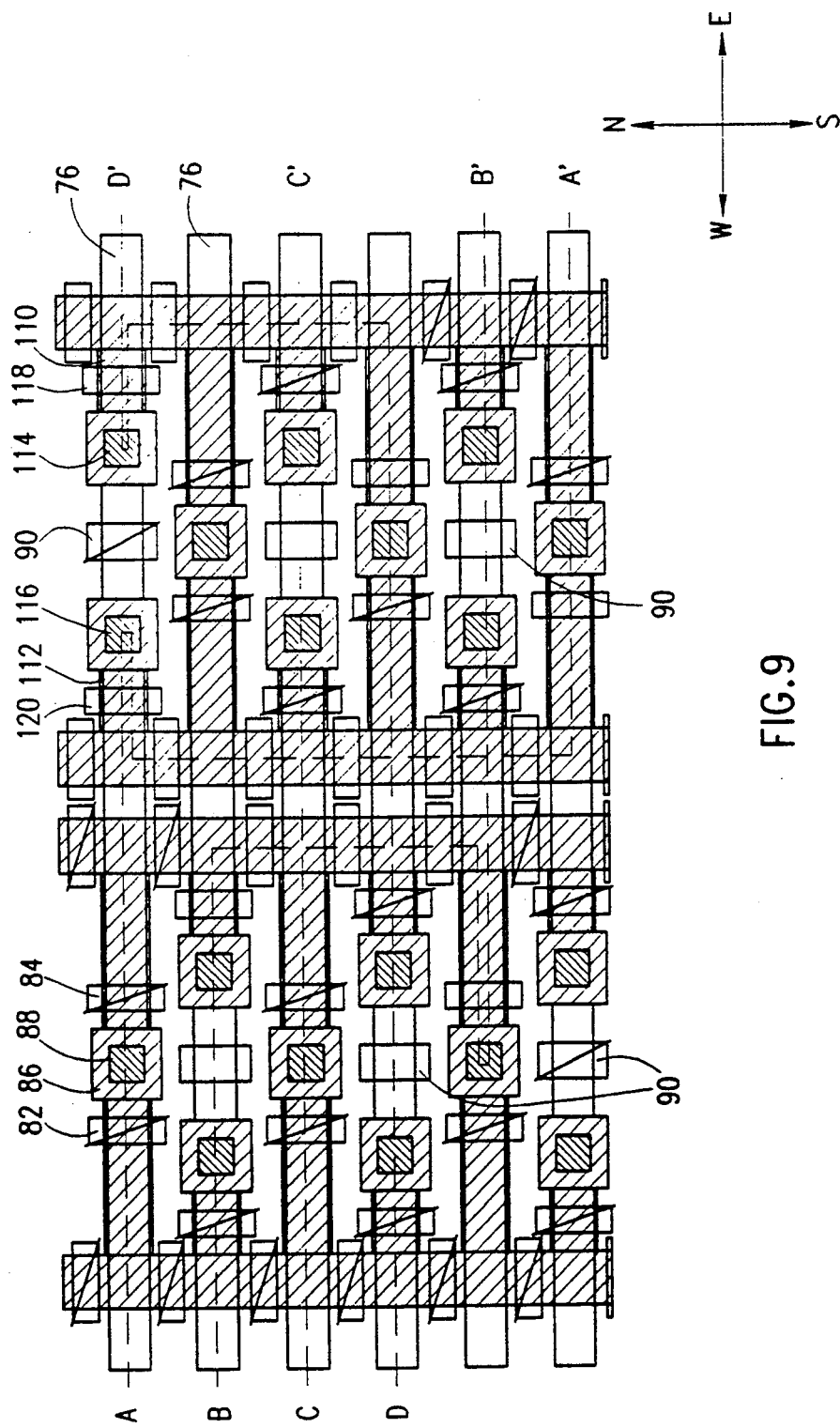
FIG. 9 is an enlarged illustration of the structure of FIG. 5 configured to define the layout of FIG. 1A.

Reference is now made to FIG. 5, which illustrates a grid array which is similar to that illustrated in FIG. 2 and which also has similarities to the grid arrays described in copending U.S. patent application No.

344,582, now U.S. Pat. No. 5,049,699 the disclosure of which is hereby incorporated by reference.

A principal distinction between the embodiment of FIG. 5 and that of FIG. 2 lies in the provision, in staggered configuration in addition to the branches 80 and associated fuses 82 and 84 and vias 88, additional partial branches 110 and 112, which extend towards each other from adjacent strips 72 and each have an associated via, 114 and 116 respectively. The partial branches 110 and 112 are provided at regions overlying strips 76 where in the embodiment of FIG. 2, no metal II was provided. The partial branches 110 and 112 facing each other but are not in contact, other than through the vias 114 and 116 and the metal I layer strips 76.

The embodiment of FIG. 5 also provides pairs of strips 72 in side by side adjacent relationship instead of single strips 72 as in the embodiment of FIG. 2. In contrast to the embodiment of FIG. 3, the adjacent strips 72 are not connected to each other. Fuses 118 and 120 are provided on respective partial branches 110 and 112.

Figure 1A:
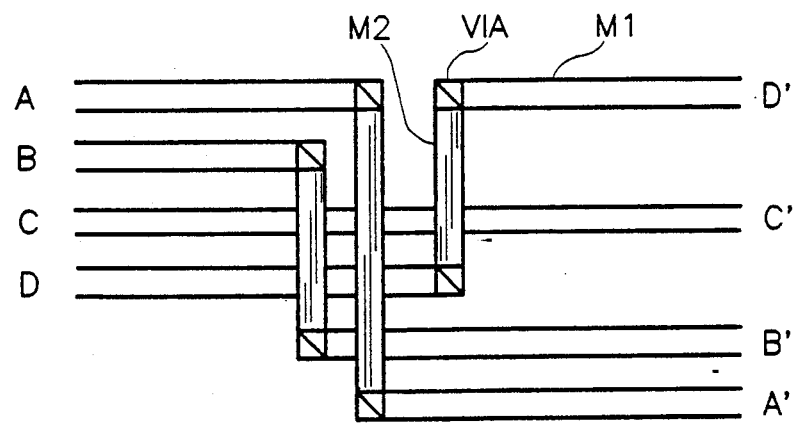
FIG. 1A illustrates a simple prior art dual metal layout wherein vias are positioned at the locations of desired direction changes.
Figure 1A:
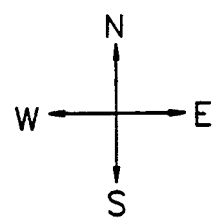
Figure 1C:
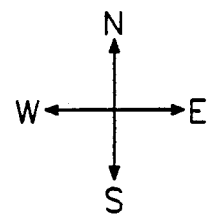
FIG. 1C illustrates a prior art equivalent circuit to that of FIG. 1A in the general structure shown in FIG. 1B.
Figure 1C:
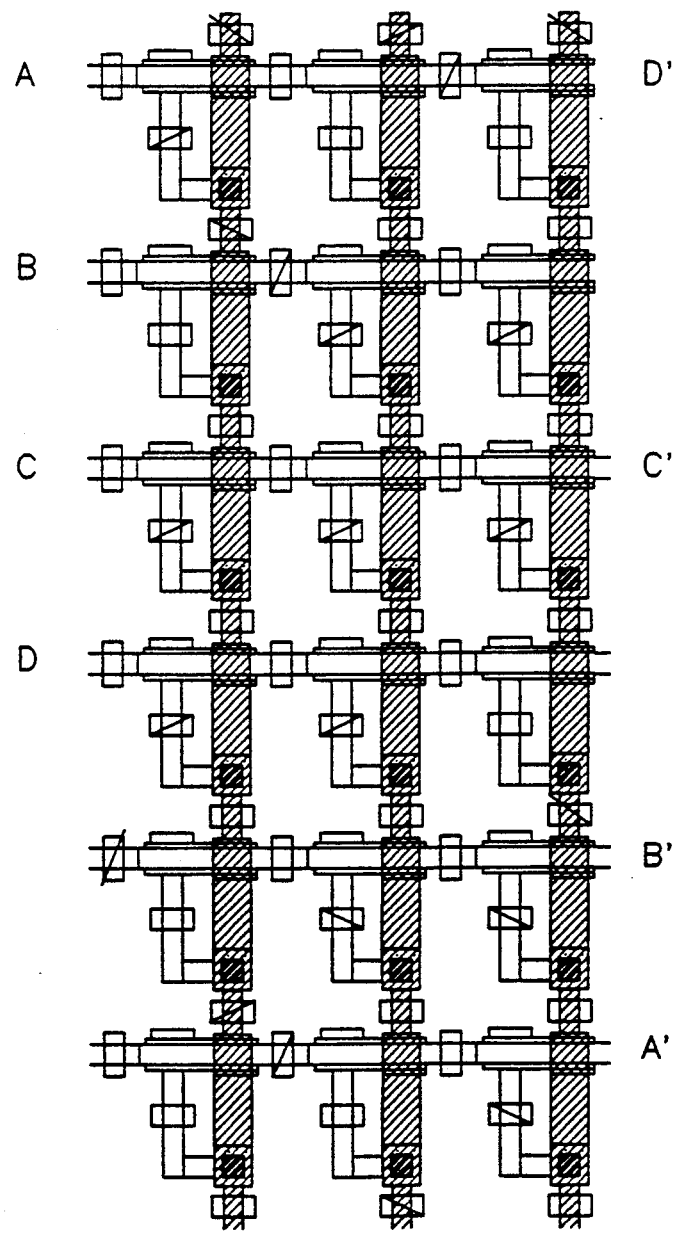

Reference is now made to FIGS. 6, 7, 8 and 9 which respectively illustrate the structures of FIGS. 2, 3, 4 and 5, each of which has been customized to correspond to the circuit topology of FIG. 1A. Fuses which have been fused are shown with a superimposed / or .

Reference is made to the following copending applications of the Applicant: U.S. Pat. No. 4,875,971; U.S. Pat. No. 5,111,273; U.S. Pat. No. 4,924,287; USSN 368,161, filed 16 June, 1989. The disclosures thereof which are incorporated herein by reference, pertain to apparatus and techniques, particularly with respect to fusing, which may be useful in putting the present invention into practice.

It will be appreciated that the layers referred to hereinabove as metal I and metal II layers need not, in fact, be made specifically of metal, but rather may be formed from any suitable electrically conducting material.

It will be appreciated by persons skilled in the art that the present invention is not limited by what has been particularly shown and described herein. Rather the scope of the present invention is defined only by the claims which follow.

We claim:

1. A selectably customizable semiconductor device comprising:
   a first metal layer disposed in a first plane and comprising first elongate strips extending parallel to a first axis;
   a second metal layer disposed in a second plane generally parallel to and electrically insulated from said first plane and comprising second elongate strips extending parallel to a second axis, said second axis being generally perpendicular to said first axis, whereby a multiplicity of elongate strip overlap locations are defined at which the elongate strips of said first and second metal layers overlap in electrical insulating relationship;
   said second metal layer comprising a plurality of columns of fusible conductive bridges joining adjacent pairs of said second elongate strips, each of said fusible conductive bridges comprising first and second fusible links;
   a via being defined between said first and second metal layers at a location along each of said fusible conductive bridges intermediate said first and second fusible links;
   said fusible conductive bridges in each column joining said adjacent pairs of said second elongate strips overlying alternating first elongate strips and being arranged in a staggered arrangement.

2. A selectably customizable semiconductor device according to claim 1 and also comprising third fusible links disposed along said first elongate strips intermediate said second elongate strips in a staggered orientation.

3. A selectably customizable semiconductor device according to claim 1 and also comprising fourth fusible links disposed along said second elongate strips intermediate said first elongate strips.

4. A selectably customizable semiconductor device according to claim 1 and wherein said second metal layer also comprises a plurality of third elongate strips, each third elongate strip being disposed parallel to and alongside each second elongate strip and being joined thereto by bridges overlapping every first elongate strip.

5. A selectably customizable semiconductor device according to claim 1 and wherein said second conductive layer also comprises a plurality of pairs of partial branches which extend towards each other from adjacent second elongate strips and a plurality of vias, each associated with one of said partial branches.

6. A selectably customizable semiconductor device according to claim 5 and also comprising fifth fusible links disposed along said partial branches.

7. A selectably customizable semiconductor device according to claim 4 and wherein partial branches are provided at regions overlying first elongate strips where said fusible conductive bridges are not provided.

8. A selectably customizable semiconductor device according to claim 1 and wherein said second conductive layer comprises a plurality of third elongate strips, each third elongate strip being disposed parallel to and alongside each second elongate strip and insulated therefrom.

9. A selectably customizable semiconductor device according to claim 1 and wherein said first metal layer is a metal I layer and said second metal layer is a metal II layer.

10. A selectably customizable semiconductor device according to claim 2 and wherein said first metal layer is a metal I layer and said second metal layer is a metal II layer.

11. An at least partially customized semiconductor device according to claim 1 and wherein at least some of said fusible links are fused.

12. An at least partially customized semiconductor device according to claim 2 and wherein at least some of said fusible links are fused.

* * * * *